US00RE47719E

(19) United States
(12) Reissued Patent
Kalliokulju et al.

(10) Patent Number: US RE47,719 E
(45) Date of Reissued Patent: Nov. 5, 2019

(54) RELOCATING CONTEXT INFORMATION IN HEADER COMPRESSION

(71) Applicant: Conversant Wireless Licensing S.a r.l., Luxembourg (LU)

(72) Inventors: Juha Kalliokulju, Vesilahti (FI); Atte Lansisalmi, Espoo (FI); Yousuf Saifullah, Richardson, TX (US); Khiem Le, Coppel, TX (US)

(73) Assignee: Conversant Wireless Licensing S.a.r.l., Luxembourg (LU)

(21) Appl. No.: 15/208,233

(22) Filed: Jul. 12, 2016

Related U.S. Patent Documents

Reissue of:
(64) Patent No.: 7,290,063
Issued: Oct. 30, 2007
Appl. No.: 09/757,913
Filed: Jan. 10, 2001

U.S. Applications:
(63) Continuation of application No. 12/265,905, filed on Nov. 6, 2008, now Pat. No. Re. 46,125, which is an application for the reissue of Pat. No. 7,290,063.

(51) Int. Cl.
*G06F 15/173* (2006.01)
*H03M 7/00* (2006.01)
(Continued)

(52) U.S. Cl.
CPC ..... *H04W 36/0033* (2013.01)

(58) Field of Classification Search
CPC ..... H04W 36/0033
(Continued)

(56) References Cited

U.S. PATENT DOCUMENTS 6,041,054 A * 3/2000 Westberg ..... 370/389
6,300,887 B1 * 10/2001 Le ..... 341/60
(Continued)

FOREIGN PATENT DOCUMENTS

WO WO 00/72549 A3 11/2000
WO 0211397 A1 2/2002

OTHER PUBLICATIONS

"Robust Header Compression (ROHC)", Burmeister et al., version 4, 2000, pp. 137.

(Continued)

*Primary Examiner* — Eron J Sorrell
(74) *Attorney, Agent, or Firm* — Conversant Wireless Licensing

(57) ABSTRACT

A method of relocating the header compression context in a packet network which transmits packets having compressed headers. A connection is established between a mobile terminal and a first network entity and context information used with compression and decompression of the headers of the packets is stored at the mobile terminal and the first network entity. The context information updating is stopped in the mobile terminal and in the first network entity and after that, a snapshot of the compression and decompression context information is taken and stored in the first network entity. The connection between the first network entity and the mobile terminal is changed to a connection between the mobile terminal and a second network entity. The context information snapshot stored by the first network entity is transferred to the second network entity to be stored therein as the context information of the second network entity. The stored context information at the mobile terminal and the second network entity is then used for compression and decompression of the headers of the packets.

12 Claims, 5 Drawing Sheets

(51) Int. Cl.
*H04J 3/18* (2006.01)
*H04L 12/28* (2006.01)
*H04W 36/00* (2009.01)

(58) Field of Classification Search
USPC ..... 709/247
See application file for complete search history.

(56) References Cited

U.S. PATENT DOCUMENTS 6,477,150 B1 * 11/2002 Maggenti et al. ..... 370/312
6,529,527 B1 * 3/2003 Chen et al. ..... 370/503
6,535,925 B1 * 3/2003 Svanbro et al. ..... 709/247
6,542,504 B1 * 4/2003 Mahler et al. ..... 370/392
6,542,931 B1 * 4/2003 Le et al. ..... 709/228
6,745,012 B1 * 6/2004 Ton ..... H04L 1/0006 455/67.13
6,839,339 B1 * 1/2005 Chuah ..... 370/349
6,970,476 B1 * 11/2005 Jonsson et al. ..... 370/401
7,035,287 B2 * 4/2006 Tourunen et al. ..... 370/477
7,054,954 B2 * 5/2006 Kalliokulju ..... 709/247
7,164,665 B2 * 1/2007 Tourunen ..... 370/329
7,995,533 B1 * 8/2011 Koodli ..... H04W 36/0011 370/331
2002/0018010 A1 * 2/2002 Le ..... 341/60
2002/0057716 A1 * 5/2002 Svanbro ..... H03M 7/30 370/477
2002/0097723 A1 * 7/2002 Tourunen et al. ..... 370/392

OTHER PUBLICATIONS

"Adaptive Header Compression (ACE)", Internet Draft, Khiem Le et al., 2000, Internet Draft, http://www.cdt.luth.se/rohc/msg00380.html.
"Handover", Burmeister, 2000, Internet Draft, http://www.cdt.luth.se/rohc/msg00257/html.
"Context Transfer", Khiem Le, 2000, Internet Draft, http://www.cdt.luth.se/robhc/msg01274.html.
Japanese Office Action, Dated Feb. 26, 2007, Application No. 2002-557095, Applicant Akitoshi Mochizuki.

* cited by examiner

RELOCATING CONTEXT INFORMATION IN HEADER COMPRESSION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*This application is a continuation reissue of U.S. patent application Ser. No. 12/265,905, filed on Nov. 6, 2008 which is an application for reissue of U.S. Pat. No. 7,290,063. The above-identified application is herein incorporated by reference in its entirety.*

BACKGROUND OF THE INVENTION

The invention relates to relocating context information in header compression.

The rapid progress in IP (Internet Protocol) technology during the last few years has also expanded the potential of using different IP-based applications outside the conventional Internet data transfer. IP-based telephony applications in particular have developed at a fast pace, as a result of which an ever expanding part of the call transmission path even in conventional telephone networks (PSTN/ISDN, Public Switched Telephone Network/integrated Services Digital Network) and mobile networks (PLMN, Public Land Mobile Network) can, in principle, be implemented by utilising IP technology.

Especially in mobile networks, IP technology offers many advantages, since in addition to the conventional voice services of mobile networks, which could be provided by means of various IP voice applications, mobile networks will provide more and more different data services, such as Internet browsing, e-mail services, games, etc., which are typically most preferably implemented as packet-switched IP-based services. This way, IP layers arranged in mobile system protocols could serve both audio/video services and various data services.

In mobile networks, it is especially important to utilise the limited radio resources as efficiently as possible. This, for its part, complicates the utilisation of the IP protocols in the radio interface, because in IP-based protocols, the proportion of various header fields of the transferred data is very large, and correspondingly, the proportion of payload is small. In addition, the bit error rate (BER) of the radio interface and the round-trip time (RTT) of the uplink and downlink directions may in bad conditions increase a great deal, which causes problems in most known header field compression methods. This has created a need to develop a header compression method suitable for different IP protocols, which would be especially suited for real-time data transfer over the radio interface: efficient header field compression which can, however, be used in conditions in which bit error rates and round-trip times increase a great deal.

For this purpose, IETF (Internet Engineering Task Force) has lately been working on the standardisation of a header field compression method known as ROHC (Robust Header Compression). One idea behind the development of ROHC is that there is a great deal of redundance between the several IP header fields used in data packet transfer, not only inside the data packet, but also between them. In other words, a large amount of the information in the header fields does not change at all during the transfer of the data packets and is thus easy to reconstruct at a receiver even though it is not transmitted. Only a small part of the header fields are such that the information they comprise requires attention during compression. Further, ROHC comprises several compression levels, whereby the efficiency of the compression increases when moving on a higher level. ROHC always tries to use the most efficient compression possible, in such a manner, however, that before moving on to the next level, a sufficient reliability of operation of the level is always ensured. ROHC also has the typical characteristic that it leaves several matters essential for the use of a compression method to be handled by the lower link layer.

ROHC, like typically all header compression techniques, require the storing of context information used for compression and decompression of headers of packets at the compressor (transmitter) and decompressor (receiver) and to initialize the compression/decompression process by sending essentially full headers. What is meant by the context information is a state which the compressor uses to compress the header field to be transmitted and the decompressor uses to decompress a received header field. When header compression/decompression is utilized with a wireless link, headers sent on the uplink traffic are compressed by the mobile terminal and decompressed by a network entity. In the downlink traffic, the network entity compresses the headers, and the mobile terminal decompresses the headers.

In normal operation of compression/decompression, the decompression context information is in synchronism with the compression context information, in the sense that when the decompression context information is used to decompress a header that was compressed with the compression context information, the original uncompressed header is reconstructed. Both the compression context information and decompression context information may be continuously updated by the compressor and decompressor respectively, in such a way that the two contexts stay in synchronism.

When a mobile terminal is handed over to another radio cell served by another network entity, if no efficient procedure is defined to relocate the context information to the new network entity, the header compression/decompression process has to again proceed through reinitialization, which entails sending full headers in both the downlink traffic and the uplink traffic. Such a reinitialization with full headers is both disruptive of the ongoing communications and consumes the bandwidth over the air interface. Therefore, a mechanism has been developed for transferring the compression and decompression context information from the old network entity to the new network entity by taking a snapshot of the compression and decompression context information between the old network and the mobile terminal and delivering this snapshot to the new network entity to be used as the compression and decompression context information. The compression and decompression are typically stopped for the time required for taking the snapshot and transferring it to the new network entity.

One problem in the context information relocation procedure described above is the long time needed for taking the snapshot and transferring it to the new network entity, while the compression and decompression must be stopped. This results in a significant break in real-time data transfer. Thus this break should be made as short as possible. Another problem is that in mobile systems, the mobile terminal does not typically know in advance, when the handover on the network side from the old network entity to the new network entity will take place. Therefore, the mobile terminal will continue to compressing the uplink data and transmitting it to the old network entity, even though the old network entity has already stopped decompressing said data due to the handover. In that case the compressed data packet sent by the terminal may be lost.

BRIEF DESCRIPTION OF THE INVENTION

It is thus an object of the invention to develop a method and an apparatus implementing the method so as to alleviate the above-mentioned problems. The object of the invention is achieved by a method and system, which are characterized by what is stated in the independent claims. Preferred embodiments of the invention are set forth in the dependent claims.

The invention is based on the idea that the context updating of the compressor and decompressor is stopped in both the mobile terminal and the old network entity, which ensures that both the mobile terminal and the old network entity use the same context, after which a snapshot of the compression and decompression context information is taken in the old network entity and transmitted to the new network entity to be stored therein. The mobile compressor compresses at least one header of at least one packet with the said context information and transmits the compressed at least one header of at least one packet to the new network entity. Then the new network entity decompresses the received at least one packet of the at least one header with the stored decompression context information. Because the context information has not changed during the relocation process, the compressor of the mobile terminal and the decompressor of the new network entity are automatically in synchronism and the data transfer can be continued.

According to a preferred embodiment of the invention, the updating of the context information can be prevented by disabling both the mobile terminal and the old network entity decompressors from sending any acknowledgements to the compressor on the opposite side. Because no acknowledgements are sent by the decompressors, the context of the compressors are not updated and both the mobile terminal and the old network entity compressors use the same context information for the compression of new packets. According to a second preferred embodiment of the invention, the mobile terminal will stop compressing and transmitting uplink data and the old network entity will stop compressing and transmitting downlink data. This results in the context information not being updated any more. According to a third preferred embodiment of the invention, the mobile terminal will continue to run the header compression and decompression normally, but the context updating of the mobile terminal context information is prevented by discarding in the old network entity compressor/decompressor any acknowledgements from or to the compressor/decompressor of the mobile terminal or by stopping to send any acknowledgements to the compressor/decompressor of the mobile terminal. Because all acknowledgements are discarded by the old network entity, the context of the mobile terminal compressor is not updated but the mobile terminal will continue to compress and transmit the uplink data with the previous context information.

The method and system of the invention provide the advantage that enables an efficient relocation of the header compression context. Further, the method of the invention provides the advantage that out-of-synchronism of the contexts between the mobile terminal and the network entities is prevented, while simultaneously minimising the break in the compression/decompression process in time domain. A yet further advantage of an embodiment of the invention is that the context relocation can be performed efficiently, so that no break occurs in data compression/decompression but it can be continued seamlessly.

BRIEF DESCRIPTION OF THE FIGURES

In the following, the invention will be described in greater detail by means of preferred embodiments, with reference to the appended drawings, in which.

DETAILED DESCRIPTION OF THE INVENTION

In the following, the invention is illustrated by the way of an example in conjunction with the header field compression method ROHC, which is particularly suitable for real-time data transfer over a radio interface. The invention is not limited to only ROHC, but it can be applied to any other header compression method, too. Furthermore, the invention is applicable to, but not limited to IP/UDP/RTP header compression. In the following, the implementation of ROHC is described for the parts essential for the invention. For a more detailed description of the compression method in question, reference is made to a yet unfinished Internet draft "Robust Header Compression (ROHC)", version 04, 11 Oct. 2000.

In different compression methods, a context is typically defined for both a compressor and a decompressor, the context being a state which the compressor uses to compress the header field to be transmitted and the decompressor uses to decompress a received header field. Typically, the context comprises an uncompressed version of the previous header field transmitted (compressor) or received (decompressor) over a data transfer connection. In addition, the context can comprise information identifying a data packet flow, such as sequence numbers or time stamps of data packets. Thus, the context typically comprises both static information, which remains the same for the entire data packet flow, and dynamic information, which changes during the data packet flow, but often does it according to a defined pattern.

ROHC uses three compression levels in such a manner that the compression is started on the lowest level and continues gradually to the higher levels. The basic principle is that compression is always performed on the highest possible level, in such a manner, however, that the compressor has sufficient certainty of the fact that the decompressor has enough information to perform decompression on the level in question. Factors affecting the move between different compression levels are variation in consecutive header fields, positive and negative acknowledgements received from the decompressor, and when there are no acknowledgements, the expiration of specific sequential counters. It is possible to move correspondingly to a lower level from a higher compression level.

Figure 1:
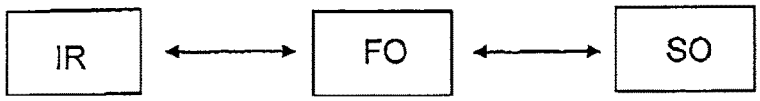
FIG. 1 is a block diagram of movements between different compression levels of ROHC.

The compression levels ROHC uses in connection with IP (Internet Protocol), UDP (User Datagram Protocol) and RTP (Real-Time Protocol) protocols are initiation/refresh (IR), first order (FO), and second order (SO), and movements between these levels are described in the diagram of FIG. 1. The IR level is used to create the context for the decompressor or to recover from an error situation. The compressor moves to the IR level when header field compression is started, requested by the decompressor, or when an update timer expires, On the IR level, the compressor sends IR header fields in an uncompressed format. The compressor tries to move to a higher level when it is certain that the decompressor has received the update information.

The FO level is used to inform the recipient of irregularities in the header fields of the data packet flow. After the IR level, the compressor operates on the FO level in a situation where the header fields do not form a uniform pattern (in other words, consecutive header fields change randomly in such a manner that the changes cannot be predicted) or the compressor cannot be certain that the decompressor has received the parameters defining the uniform pattern of the header fields. This is a typical situation when transmitting speech, for instance, is started, especially during the first speech bursts. On the FO level, the compressor sends compressed FO header fields. The compressor again tries to move to a higher level if the header fields form a uniform pattern and it is certain that the decompressor has received the parameters defining the uniform pattern. The FO-level data packets comprise typically context update information, which means that a successful decompression also requires a successful transmission of consecutive FO header fields. Thus, the success of the decompression process is sensitive to lost or damaged FO-level packets.

On the SO level, compression is optimal. The header fields form a uniform pattern which the compressor depicts with compressed SO header fields which, in practice, are sequence numbers of the data packets. Information is transmitted already on FO level to the decompressor on parameters defining the uniform pattern of the header fields, and on the basis of the parameters and the received sequence number, the decompressor can extrapolate the original header fields. Because the data packets sent on the SO level are, in practice, independent of each other, the error sensitivity of decompression is also low. When the header fields no longer form a uniform pattern, the compressor moves back to the FO level.

Decompression also has three levels which are bound to the context definition of the decompressor. The decompressor always starts its operation from the lowest level when no context has yet been defined (No Context). The decompressor has then not yet decompressed any data packets. When the decompressor has decompressed the first data packet which comprises both static and dynamic context information, it can move over the middle level (Static Context) straight to the top level (Full Context). As a result of several error situations on the top level, the decompressor moves to the middle level, but typically even one successfully decompressed data packet returns the decompressor to the top level.

Figure 2:
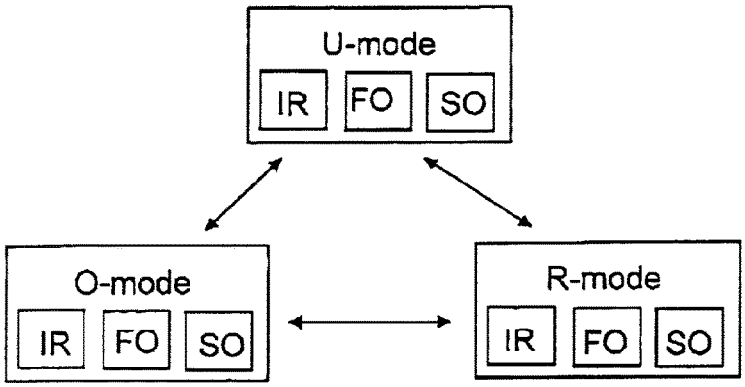
FIG. 2 is a block diagram of movements between different compression modes of ROHC.

In addition to different compression levels, ROHC has three different operational modes: unidirectional mode (U mode), bi-directional optimistic mode (O mode), and bi-directional reliable mode (R mode), which are shown in the diagram of FIG. 2. According to FIG. 2, each compression level (IR, FO, SO) described above functions in each mode, but each mode functions in its own way on each level and also makes decisions on moving between levels in its own way. The selection of the mode for each compression situation depends on the parameters of the used data transfer connection, such as the possibility to use a return channel, error probabilities and distribution, effects of variation in the size of the header fields.

In the unidirectional mode, data packets are transmitted from compressor to decompressor only, so the U mode of ROHC is useful in situations where the use of a return channel is not possible or desirable. In the U mode, moving between different compression levels is done as a result of the expiration of certain sequential counters or on the basis of variation in the header field patterns. Because no return channel is used, compression in the U mode is less efficient and the disappearance of data packets on the transmission path more probable than in either of the bidirectional modes. Using ROHC is always started in the U mode and moving to either of the bi-directional modes can take place when the decompressor has received at least one packet and as a response to the packet, the decompressor indicates that a mode change is necessary.

The bidirectional optimistic mode is similar to the unidirectional mode with the exception that in the O mode, a return channel is used to correct error situations and to acknowledge significant context updates from the decompressor to the compressor. Sequential updates are not made in the O mode. The O mode is preferably suited for connections which require optimal compression efficiency with a small return channel traffic. The O mode provides a reasonably reliable data packet transfer, in which the synchronisation between the compressor and decompressor can typically be maintained well and data packets are seldom lost and if they are, in negligible numbers. At very high bit error rates, data packets can, however, be lost on the transmission path.

The bidirectional reliable mode differs clearly from the above-mentioned modes. The R mode uses a return channel to acknowledge all context updates, also to acknowledge sequence number updates. Thus in the R mode, data packets can nearly entirely reliably be transmitted between the compressor and decompressor. Compressing header fields cannot cause the disappearance of data packets in the R mode. A drawback of the R mode is that the size of the header field is in some cases slightly larger than in the above-mentioned modes and that the return channel traffic increases considerably.

The three operational modes and three compression levels of ROHC form different operating situations for the compression of the header fields, each situation requiring the definition of the operation of the compressor and decompressor (i.e. context information) and the transmission of packets between them. Certain parameters are negotiated separately for each data packet flow by the compressor and decompressor. According to the ROHC definitions, the lower protocol layer (link layer) used at each time must provide a mechanism for the negotiation of the parameters used in compressing the header fields. The parameters are negotiated before starting the compression.

In the following, as the relocation procedure is explained, the term "the old network entity" is referred to the network entity which the mobile terminal is in connection with when the relocation procedure is about to start. "The old network entity" can also be referred to "the first network entity", The term "the new network entity" is referred to the network entity to which the connection of the mobile terminal is moved during the relocation procedure. "The new network entity" can also be referred to "the second network entity", respectively.

When a mobile terminal is handed over to another radio cell served by another network entity, the relocation of context information from the old network entity to the new network entity must be performed as well. According to a known solution, this can be done by taking a snapshot of the compression and decompression context information used between the old network and the mobile terminal and delivering this snapshot to the new network entity to be used as the compression and decompression context information. According to said prior known solution, the compression and decompression are stopped for the time required for taking the snapshot and transferring it to the new network entity.

For the downlink traffic, the old network entity contains the compression context information, which is in-synchronism with mobile decompressor decompression context information. The old network entity transmits a snapshot of the compression context information to the new network entity which stores the received context information as the context information of the new network entity. The new network entity uses the stored compression context information to compress a header of at least one packet transmitted to the mobile decompressor and the mobile decompressor uses the previously saved decompression context information to decompress the header of the at least one data packet. For the uplink traffic, the old network entity contains the decompression context information, which is in-synchronism with mobile compressor compression context information. The old network entity transmits the snapshot of the decompression context information to the new network entity, which stores said snapshot to be used as its decompression context information. The mobile compressor compresses at least one header of at least one packet with its context information and transmits the compressed at least one header of at least one packet to the new network entity. Then the new network entity decompresses the received at least one packet of the at least one header with the stored decompression context information.

The relocation can be performed either concurrently with or after the radio handover. Therefore the order of the actions of taking the snapshots of the context information and transmitting them between the network entities may vary depending on the embodiment, but in any case, in prior known solutions, the compression and decompression are stopped for the time required for taking the snapshots and transferring them to the new network entity. Because the compression/decompression process is asynchronous relative to and independent of the handover process, since the former is driven by the flow of packets, while the latter is driven by the radio conditions, this may cause a remarkable break in real-time data transfer. Furthermore, the mobile terminal does not typically know in advance, when the handover on the network side from the old network entity to the new network entity will take place. Therefore, in prior known solutions, the mobile terminal will continue to compress the uplink data and transmit it to the old network entity, even though the old network entity has already stopped decompressing said data due to the handover. Hence, by the time the new network entity uses the transferred context information, it may already be out-of-synchronism with the contexts at the mobile terminal. Therefore said out-of-synchronism of the contexts should be prevented, while simultaneously minimising said break in the compression/decompression process in time domain.

According to the invention, this is achieved by stopping the context updating of the compressor and decompressor in both the mobile terminal and the old network entity, which ensures that both the mobile terminal and the old network entity use the same context, after which a snapshot of the compression and decompression context information is taken in the old network entity and transmitted to the new network entity to be stored therein. The mobile compressor compresses at least one header of at least one packet with the said context information and transmits the compressed at least one header of at least one packet to the new network entity. Then the new network entity decompresses the received at least one packet of the at least one header with the stored decompression context information. Because the context information has not changed during the relocation process, the compressor of the mobile terminal and the decompressor of the new network entity are automatically in synchronism and the data transfer can be continued.

According to a first preferred embodiment of the invention, this can be accomplished by signalling from the radio network to the mobile terminal that handover (and thus the context relocation as well) will happen shortly, which means that the context information should not be updated any more. The updating of the context information can be prevented by disabling both the mobile terminal and the old network entity decompressors from sending any acknowledgements to the compressor on the opposite side. Because no acknowledgements are sent by the decompressors, the context of the compressors are not updated and both the mobile terminal and the old network entity compressors use the same context information for the compression of new packets. After this, a snapshot of the compression and decompression context information is taken in the old network entity and transmitted to the new network entity to be stored therein. The mobile compressor compresses at least one header of at least one packet with the said context information and transmits the compressed at least one header of at least one packet to the new network entity. Then the new network entity decompresses the received at least one packet of the at least one header with the stored decompression context information.

According to a second preferred embodiment of the invention, the context updating of the mobile terminal and the old network entity can be prevented by signalling from the radio network to the mobile terminal that handover (and thus the context relocation as well) will happen shortly, in response to which the mobile terminal will stop compressing and transmitting uplink data and the old network entity will stop compressing and transmitting downlink data. This results in the context information not being updated any more. The current context information is stored in the mobile terminal, which is thus ready to refresh said context information from the memory and use it for the compression of new packets, when needed, A snapshot of the compression and decompression context information is taken in the old network entity, preferably after a certain delay, and transmitted to the new network entity to be stored therein. By waiting a reasonable time of said delay a certainty can be had that all compressed and sent packets are received and decompressed correctly by the respective decompressor. Then the mobile compressor compresses at least one header of at least one packet with the said context information and transmits the compressed at least one header of at least one packet to the new network entity. Then the new network entity decompresses the received at least one packet of the at least one header with the stored decompression context information.

Both of the above-mentioned embodiments function very well in conditions when the instant of time of the handover is known in advance, so the mobile terminal can be informed in forehand of the coming handover. However, it is not always possible to know in advance when the handover is going to take place, e.g. in a situation when the mobile terminal disappears from the radio coverage of the old cell and suddenly appears to the new cell. Thus, it is not always possible to inform the mobile terminal in forehand about the relocation. According to a third preferred embodiment of the invention, the mobile terminal will continue to run the header compression and decompression normally, but the context updating of the mobile terminal context information is prevented by discarding in the old network entity compressor/decompressor any acknowledgements to or from the compressor/decompressor of the mobile terminal. As an alternative solution of the embodiment, discarding of the acknowledgements to the mobile terminal in the old network entity can be replaced by configuring the compressor of the old network entity not to send any acknowledgements during the relocation procedure. Because all acknowledgements are either discarded or not sent by the old network entity, the context of the mobile terminal compressor is not updated but the mobile terminal will continue to compress and transmit the uplink data with the previous context information. After this, a snapshot of the compression and decompression context information is taken in the old network entity and transmitted to the new network entity to be stored therein. The mobile compressor compresses at least one header of at least one packet with the said context information and transmits the compressed at least one header of at least one packet to the new network entity. Then the new network entity decompresses the received at least one packet of the at least one header with the stored decompression context information. This embodiment enables the header compression context relocation to be performed also in conditions, where it might be impossible to inform the mobile terminal about the handover in advance. If ROHC header compression mechanism is used herewith, the process of discarding the acknowledgements will preferably take place in the protocol layer below the ROHC implementation, since ROHC definitions does not include any implementation interface for enabling the required configuration. If the compressor of the old network entity is alternatively configured not to send any acknowledgements during the relocation procedure, this can also be implemented easily by adding a predefined interface between the compressor and the lower layers.

The signalling mechanism of mobile networks is typically defined so that it does not support context relocation very efficiently, since the structure of packet radio networks is mainly designed for non-real-time data transfer. Therefore, according to the known solutions, the transmitting of the context information snapshot from the old network entity to the new network entity would take place in the same message, which would also contain the command for shifting the actual control of the connections to the new network entity. The message can be called Relocation_commit message, which is typically the last message transmitted from the old network entity to the new network entity during the relocation process. Because the new network entity receives the context information snapshot from the old network entity simultaneously with the command to take over the control of the connections, this will result in break in data compression/decompression, since there is always a non-zero preparation time for the new network entity to store said received context information and to configure its compressor and decompressor according to the received context information. Also transferring the context information from the old network entity to the new network entity takes some time.

Said break can be minimised and the above-mentioned embodiments further enhanced according to a preferred embodiment of the invention, wherein a further message containing the context information snapshot is transmitted from the old network entity to the new network entity after the relocation process has started but before the command to take over the control of the connections. This enables the new network entity to store said received context information and to configure its compressor and decompressor before the actual control is handed over by the Relocation_commit message. This way the context relocation can be performed efficiently, so that no break occurs in data compression/decompression but it can be continued seamlessly when the control is given by the Relocation_commit message.

In the third embodiment of the invention described above, where all acknowledgements are discarded by the old network entity, there may occur a situation during the relocation process wherein the mobile terminal should update its context information, e.g. due to disturbance on the radio interface, and it sends context update request to the old network entity, but the update is not possible because acknowledgements are not allowed to trigger any events on the network side. This results in the fact that the context information of the mobile terminal is out-of-synchronism in respect to the snapshot context information currently being updated to the new network entity. Again a break will take place in the data compression/decompression, when the context information of the mobile terminal and the new network entity are synchronised.

The synchronisation can be speeded up by a preferred embodiment of the invention, wherein the context update request sent by the mobile terminal is detected by the old network entity, which attaches this indication to any message (e.g. Relocation_commit message) to be sent to the new network entity after the snapshot of the context information has been taken. This way the new network entity receives information about the needed context update and after the relocation is accomplished, the new network entity can send the first packet to the mobile terminal as a context update message. The mobile terminal updates its context information according to the context information received said packet containing the context update message. Then mobile decompressor decompresses the received at least one packet of the at least one header with the stored decompression context information and updates it context information according to the received context update message. This will speed up the context re-synchronisation if the compression synchronisation has been lost during relocation procedure.

Similarly, the old network entity may as well end up in a situation during the relocation process wherein it should update its context information, but the update is not possible because it cannot send any acknowledgements to the mobile terminal. Also in this situation the above-mentioned embodiment of the invention can be utilised, wherein the context update indication is attached to any message (e.g. Relocation_commit message) to be sent to the new network entity after the snapshot of the context information has been taken. Again, the new network entity receives information about the needed context update, which will be further indicated to the mobile terminal, when the relocation process has been accomplished. Alternatively, said context update indication attached to the message (e.g. Relocation_commit message) and sent by the old network entity to the new network entity can used as a trigger in decompressor of the new network entity to initiate immediately a context refresh update.

The method and its embodiments described above can preferably be applied for instance to third-generation mobile systems called UMTS (Universal Mobile Telecommunication System) and IMT-2000 (International Mobile Telephone System), and in the further development projects of the second-generation mobile systems, such as GERAN (GSM Edge Radio Access Network).

In the following, the invention will be illustrated by means of an example in connection with a packet radio service of the UMTS system, particularly in connection with internal handover between radio network subsystems of the UMTS (SRNS Relocation), during which also the header compression context information must be relocated from the old radio network controller RNC to the new radio network controller. However, the invention is not limited to the UMTS system, but may be applied to any packet-switched data transmission method in which the header compression context information relocation must be performed.

Figure 3:
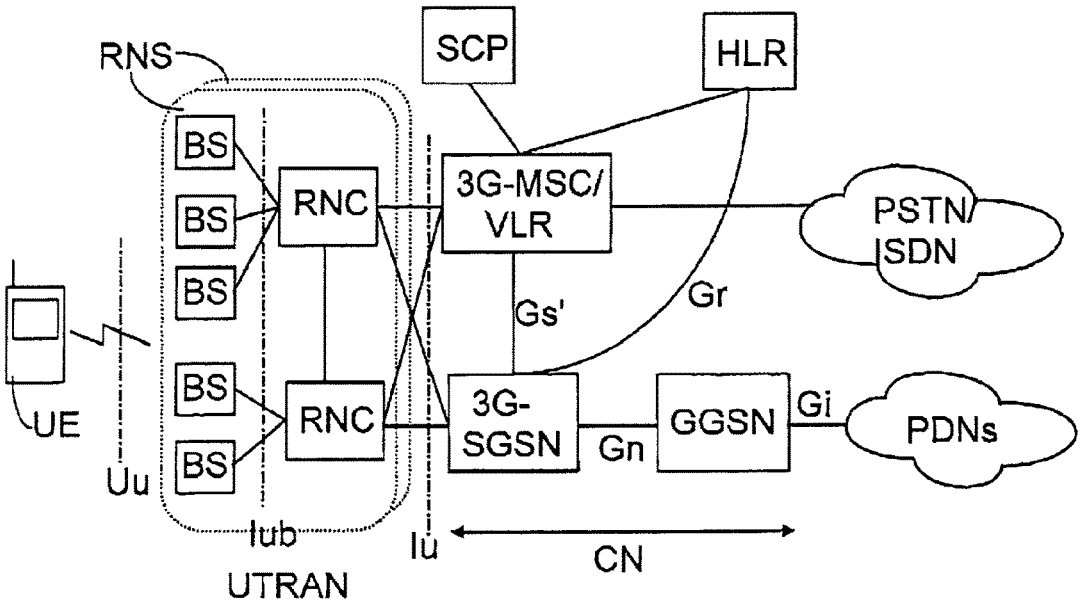
FIG. 3 is a block diagram of a simplified structure of the UMTS system.

The structure of the UMTS mobile communication system will be described with reference to FIG. 3. FIG. 3 includes only the blocks relevant to describing the invention but it is obvious to a person skilled in the art that a conventional mobile communication system also comprises other functions and structures that need not be explained more closely in this context. The main elements of a mobile communication system are a core network CN and a UMTS terrestrial radio access network UTRAN, which form the fixed network of the mobile communication system, and a mobile terminal or user equipment UE. The interface between the CN and the UTRAN is called lu and the interface between the UTRAN and the UE is known as Uu.

The UTRAN typically consists of several radio network subsystems RNS between which there is an interface called lur (not shown). The RNS consists of radio network controllers RNC and one or more base stations BS, which are also called node Bs. The interface between the RNC and the BS is called lub. The base station BS is typically responsible for implementation of the radio path, and the radio network controller RNC at least for the following matters: radio resource management, controlling of handover between cells, power control, timing and synchronization, paging of subscriber terminals.

The core network CN consists of infrastructure belonging to a mobile communication system outside the UTRAN. In the core network, a mobile switching centre/visitor location register 3G-MSC/VLR communicates with a home location register HLR and preferably also with a service control point SCP of the intelligent network. The home location register HLR and the visitor location register VLR contain information on mobile subscribers: the home location register HLR contains information on all subscribers of the mobile communication network and on the services ordered by them, and the visitor location register VLR contains information on mobile stations which visit the area of a certain mobile switching centre MSC. The connection to a serving GPRS support node 3G-SGSN of the radio system is established via a Gs' interface and to a public switched telephone network PSTN/ISDN via a gateway mobile switching centre GMSC (Gateway MSC, not shown). A connection is established from the serving support node 3G-SGSN to the gateway GPRS support node GGSN via a Gn interface, and further from the GGSN to external data networks PDN. Both the mobile switching centre 3G-MSCNLR and the serving support node 3G-SGSN communicate with the radio network UTRAN (UMTS Terrestrial Radio Access Network) via the lu interface.

The UMTS system thus also comprises a packet radio system which is implemented to a great extent in accordance with the GPRS system connected to the GSM network, for which reason the names of the network elements contain references to the GPRS system. The packet radio system of the UMTS may comprise several serving support nodes and gateway support nodes, and typically several serving support nodes 3G-SGSN are connected to one gateway support node 3G-GGSN. Both the 3G-SGSN node and the 3G-GGSN node function as routers which support mobility of the mobile terminal and control the mobile communication system and route data packets to mobile terminals regardless of their location and the protocol used. The serving support node 3G-SGSN communicates with a mobile terminal UE via the radio network UTRAN. The function of the serving support node 3G-SGSN is to detect mobile terminals capable of packet radio connections in its area, send data packets to and receive them from these mobile terminals and to monitor the location of the mobile terminals in its service area. In addition, the serving support node 3G-SGSN communicates with the mobile switching centre 3G-MSC and the visitor location register VLR via the signalling interface Gs' and with the home location register HLR via the Gr interface. The home location register HLR also contains records which are related to the packet radio service and include the contents of subscriber-specific packet data protocols.

The gateway support node 3G-GGSN functions as a gateway between the packet radio system of the UMTS network and an external data network PDN (Packet Data Network). External data networks include a UMTS or a GPRS network of another network operator, the Internet, an X.25 network or a private local area network. The gateway support node 3G-GGSN communicates with these data networks via a Gi interface. The data packets to be transmitted between the gateway support node 3G-GGSN and the serving support node 3G-SGSN are always encapsulated according to a gateway tunnelling protocol GTP. The gateway support node 3G-GGSN also contains the PDP addresses (Packet Data Protocol) of mobile terminals and the routing data, i.e. 3G-SGSN addresses. Thus the routing data are used for linking data packets between the external data network and the serving support node 3G-SGSN. The network between the gateway support node 3G-GGSN and the serving support node 3G-SGSN is a network which utilizes the IP protocol, preferably IPv6 (Internet Protocol, version 6).

Figure 4:
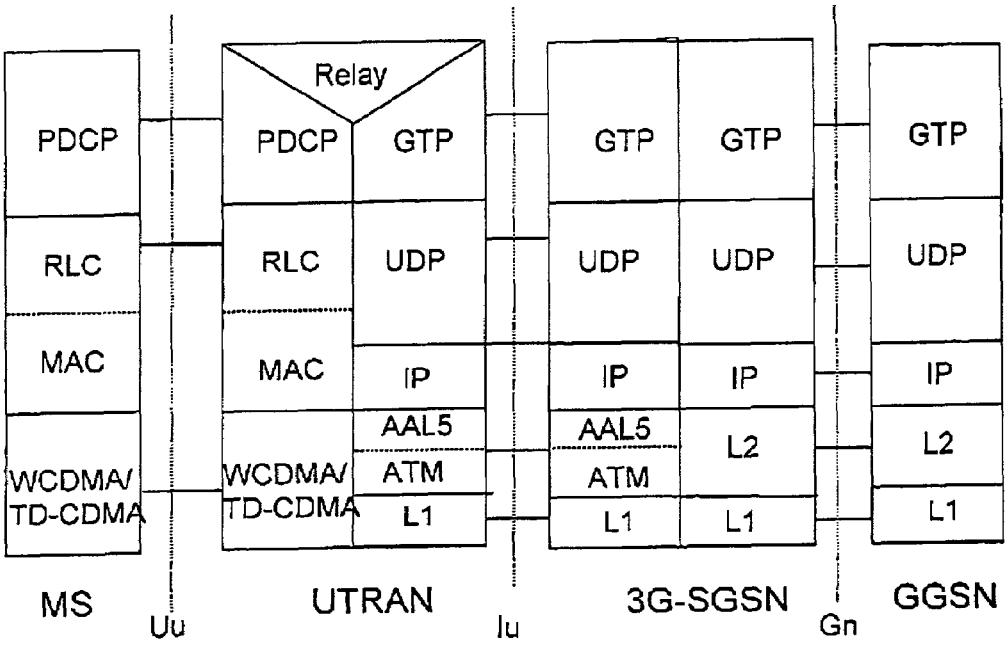
FIG. 4 shows protocol stacks of the UMTS packet data service for transmitting user data.

In the UMTS, a protocol stack according to FIG. 4 is used in the transmission of packet-switched user data (user plane). At the interface Uu between the radio network UTRAN and the mobile terminal UE, lower-level data transmission is carried out according to the WCDMA or TD-CDMA protocol in the physical layer. Data packets are transmitted between the physical layer and the RLC layer (Radio Link Control) by a MAC layer (Media Access Layer) which is above the physical layer, and the RLC layer is responsible for logical management of radio links of different radio bearers. The functionalities of the RLC include segmentation of user data to be transmitted (RLC-SDU, Service Data Unit) into one or more RLC data packets RLC-PDU. The data packets (PDCP-PDU) of the PDCP layer on top of the RLC and the header fields related to them can be compressed, if desired, by using any header compression method supported by the radio network UTRAN and the mobile terminal UE. After this, the PDCP-PDUs, which correspond to one RLC-SDU, are supplied to the RLC. The user data and the RLC-SDUs are segmented and transmitted in RLC frames to which address and control information necessary for data transmission has been added. The RLC layer is also responsible for retransmission of damaged frames. The serving support node 3G-SGSN is responsible for routing the data packets arriving from the mobile terminal UE via the radio network RAN further to the correct gateway support node 3G-GGSN. This connection uses the tunnelling protocol GTP, which encapsulates and tunnels all the user data and signalling transmitted via the core network. The GTP protocol is run above the IP used by the core network.

When the radio bearer for packet-switched user data is established (RB establishment) or reconfigured between the mobile terminal and the radio network, both peers negotiate the parameters of the radio bearer using signalling according to a radio resource control protocol RRC. The radio resource control protocol RRC is responsible e.g. for establishing, configuring, maintaining and terminating radio connections between the mobile terminal and the radio network UTRAN and for transmitting control information transmitted from the core network CN and the radio network RAN to the mobile terminals UE. One of the parameters defining the radio bearer is the header compression method used by the terminal. Compressing the headers of data packets to be transmitted and decompressing received data packet headers is in the UMTS system performed on the packet data convergence protocol PDCP layer belonging to the packet data protocol. The tasks of the PDCP layer include functions related to improving channel efficiency, which are typically based on different optimisation methods, such as the utilisation of data packet header compression algorithms. Because currently the network-level protocols designed for UMTS are IP protocols, the compression algorithms used are those standardised by IETF (Internet Engineering Task Force). Thus, the ROHC compression method is especially well-suited for the UMTS system.

Figure 5:
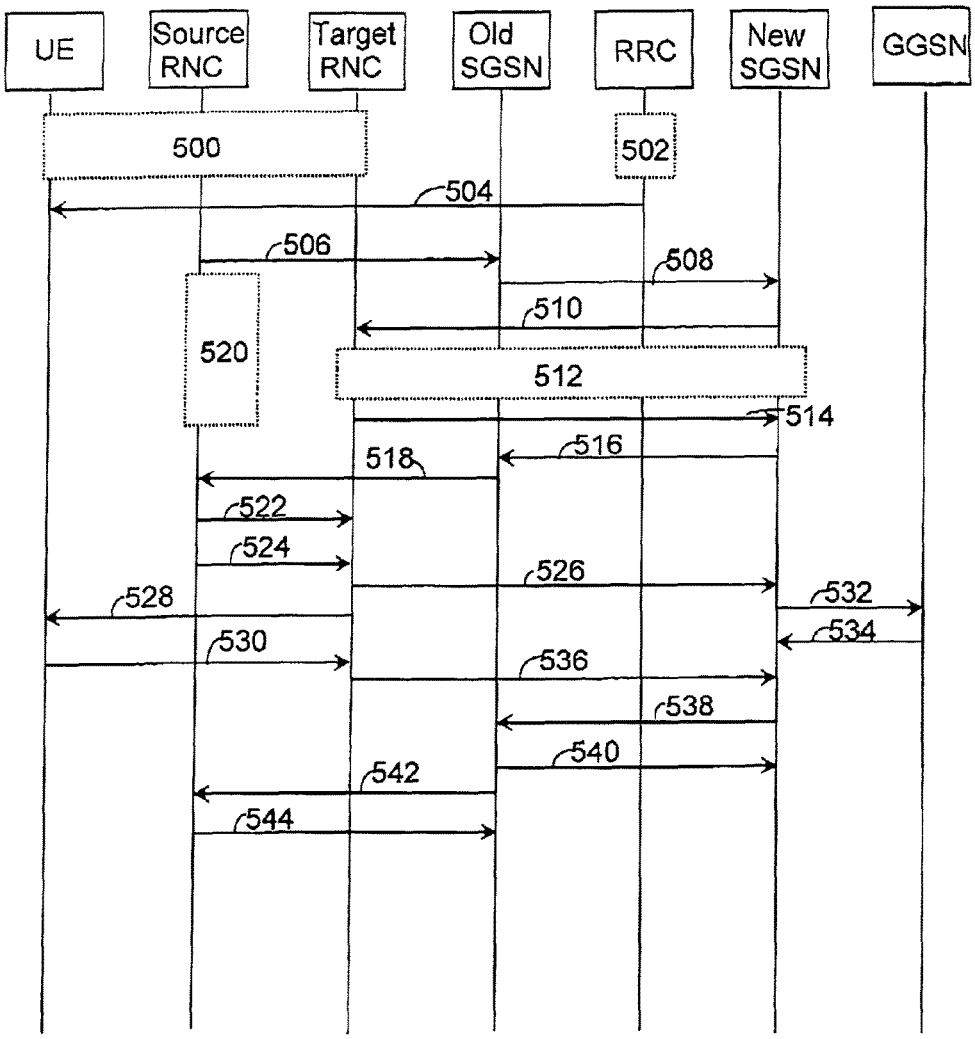
FIG. 5 shows a signalling chart of serving radio network sub-system (SRNS) relocation according to a first preferred embodiment of the invention.
Figure 6:
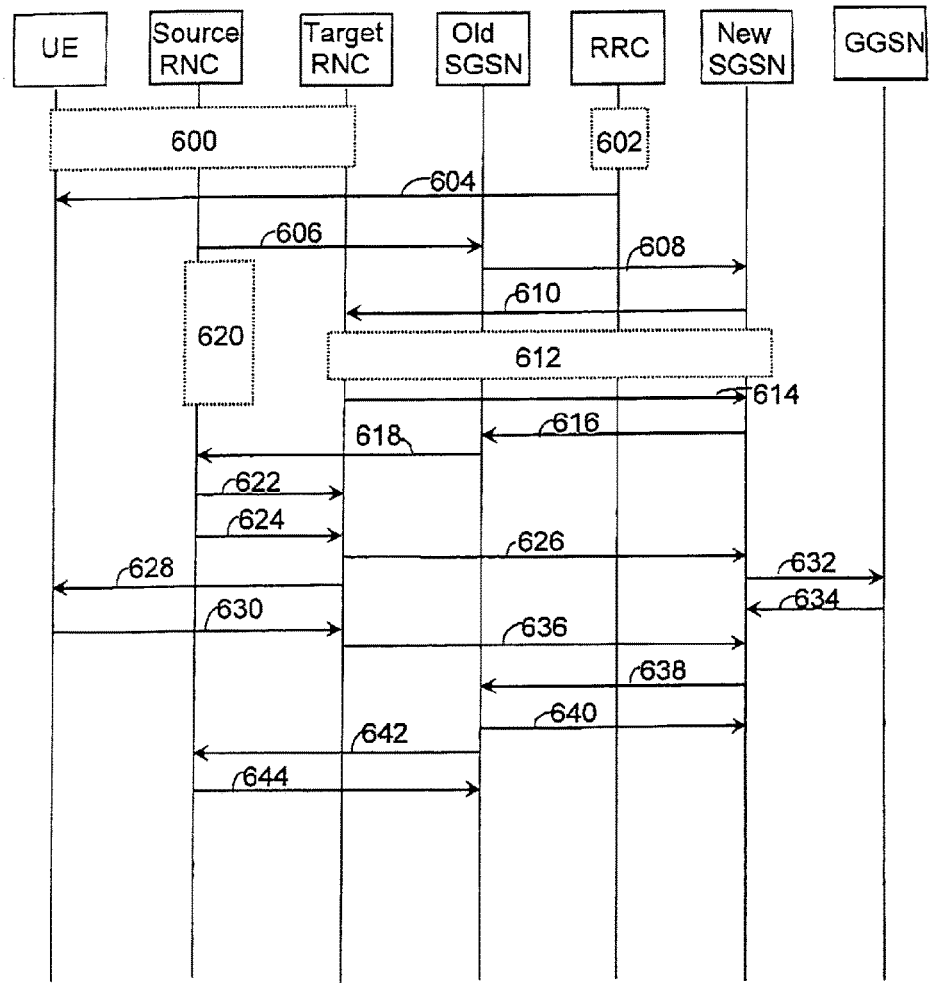
FIG. 6 shows a signalling chart of serving radio network subsystem (SRNS) relocation according to a second preferred embodiment of the invention.
Figure 7:
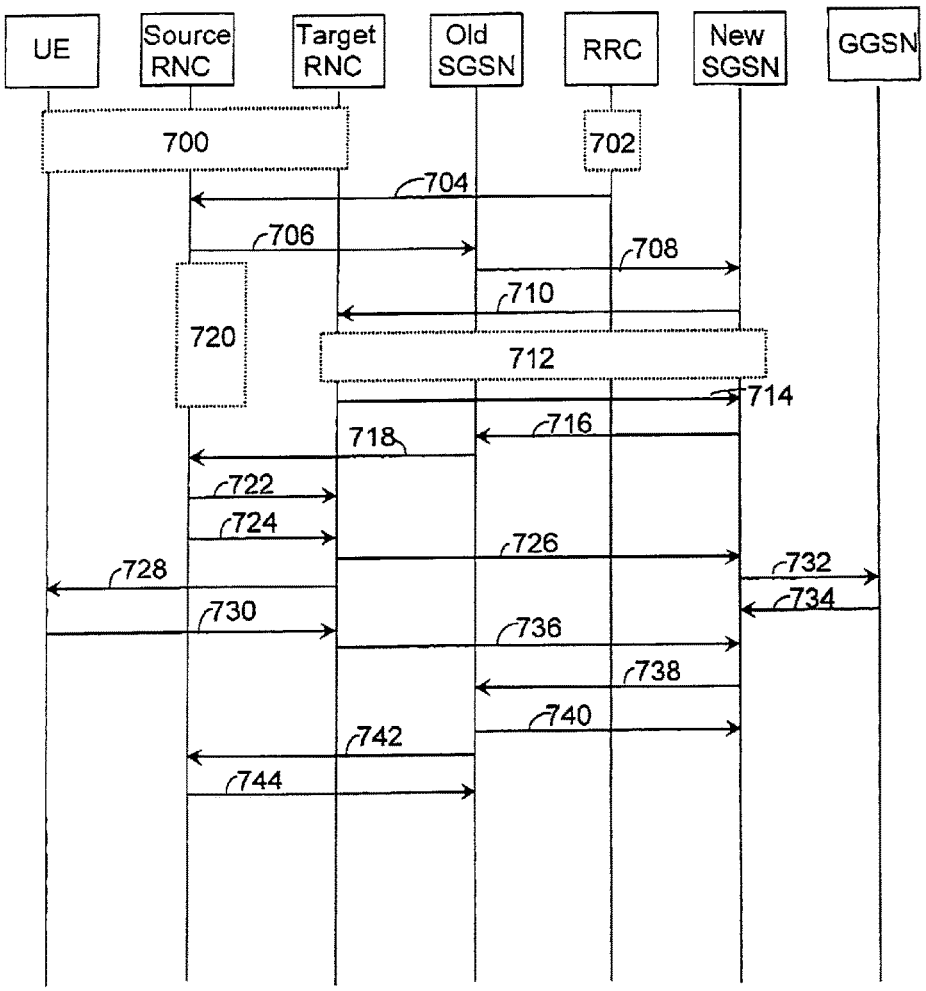
FIG. 7 shows a signalling chart of serving radio network subsystem (SRNS) relocation according to a third preferred embodiment of the invention.

The implementation of the invention in the UMTS system will be explained by referring to FIGS. 5 to 7 in regard to serving radio network subsystem (SRNS) relocation.

In the UMTS system, when a mobile terminal UE is handed over to another radio cell served by radio network controller RNC, the relocation of context information to the new radio network controller RNC must be performed as well. According to a known solution, this can be done by taking a snapshot of the compression and decompression context information used between the old radio network controller (source RNC) and the mobile terminal and delivering this snapshot to the new radio network controller (target RNC) to be used as the compression and decompression context information. The transmission of the snapshot is performed as included in the signalling messages of the SRNS relocation signalling according to the UMTS system. The compression and decompression are stopped for the time required for taking the snapshot and transferring it to the target RNC.

According to the invention, the out-of-synchronism of the contexts in the UMTS system is prevented, while simultaneously minimising the break in the compression/decompression process in time domain by stopping, in response to the decision to perform SRNS relocation, the context updating of the compressor and decompressor in both the mobile terminal and the source radio network controller (source RNC), which ensures that both the mobile terminal and the source RNC use the same context, after which a snapshot of the compression and decompression context information is taken in the source RNC and transmitted to the target radio network controller (target RNC) to be stored therein. The mobile compressor compresses at least one header of at least one packet with the said context information and transmits the compressed at least one header of at least one packet to the target RNC. Then the target RNC decompresses the received at least one packet of the at least one header with the stored decompression context information. Because the context information has not changed during the relocation process, the compressor of the mobile terminal and the decompressor of the target RNC are automatically in synchronism and the data transfer can be continued.

The implementation of the first preferred embodiment of the invention in the UMTS system will be further explained with reference to FIG. 5. On the basis of the movements of the mobile terminal UE or changes in radio conditions, for example, a decision is made in the radio resource controller RRC to perform SRNS relocation (500, 502). According to the invention, radio resource controller RRC signals to the mobile terminal UE that handover (and thus the context relocation as well) will happen shortly (504), in response to which the mobile terminal UE stops updating the context information. The signalling to the mobile terminal UE can be preferably carried out either as RRC signalling or as inband signalling on the PDCP layer. The updating of the context information can be prevented by disabling both the mobile terminal and the source RNC decompressors from sending any acknowledgements to the compressor on the opposite side. Because no acknowledgements are sent by the decompressors, the context of the compressors are not updated and both the mobile terminal and the source RNC compressors use the same context information for the compression of new packets. After this, the source RNC starts a prior known SRNS relocation procedure by sending a Relocation_required message to the old SGSN (506), which is further forwarded via the new SGSN (508) to the target RNC (510). Radio bearers are established between the new SGSN and the target RNC according to the instructions given by the RRC (512). The target RNC sends an acknowledgement to the relocation request, which acknowledgement is routed via the new SGSN (514) to the old SGSN (516) and further to the source RNC as a Relocation_command message (518). During the SRNS relocation procedure a snapshot of the compression and decompression context information is taken in the source RNC (520) and transmitted from the source RNC to the target RNC at latest in a Relocation_commit message (522) to be stored in the target RNC. The source RNC will forward the possible downlink data to be sent to the mobile terminal UE to the target RNC (524), which confirms the relocation by sending Relocation_detect message to the new SGSN (526). The target RNC also sends a RNTI_reallocation message (528) to the mobile terminal UE, which indicates the identification of the new RNC to the mobile terminal and in which the target RNC compressor preferably transmits an indication of the context update, if required. This can be done only if the source RNC is already released from the connection after the snapshot has been transmitted to the target RNC (522). Otherwise, the context update has to be performed in connection of some later signalling between the target RNC and the mobile terminal UE. The mobile terminal UE acknowledges the change of RNC by sending a confirmation as a RNTI_reallocation_complete message (530). Now the relocation of the context information to the target RNC is performed successfully, while simultaneously preventing the out-of-synchronism of the contexts and minimising the break in the compression/decompression process. Meanwhile, the new SGSN has updated the PDP context to the GGSN (532, 534). The target RNC confirms the relocation by sending a Relocation_complete message to the new SGSN (536), which is further forwarded to the old SGSN (538) and acknowledged back to the new SGSN (540). After this, the connection between the source RNC and the old SGSN is disconnected (542, 544).

The implementation of the second preferred embodiment of the invention in the UMTS system will be further explained with reference to FIG. 6. Again, a decision is made in the radio resource controller RRC to perform SRNS relocation (600, 602). According to this embodiment of the invention, radio resource controller RRC signals to the mobile terminal UE that handover (and thus the context relocation as well) will happen shortly (604), in response to which the mobile terminal UE will stop compressing and transmitting uplink data and the source RNC will stop compressing and transmitting downlink data. The signalling to the mobile terminal UE and to the source RNC can be preferably carried out either as RRC signalling or as inband signalling on the PDCP layer. This results in the context information not being updated any more. The current context information is stored in the mobile terminal UE, which is thus ready to refresh said context information from the memory and use it for the compression of new packets, when needed. After this, the source RNC starts a prior known SRNS relocation procedure, similar to what is described already above with respective reference numbers and therefore, it is not necessary to explain again herewith. A snapshot of the compression and decompression context information is taken in the source RNC, preferably during said SRNS relocation procedure and after a certain delay, and transmitted to the target RNC at latest in a Relocation_commit message (622) to be stored in the target RNC. By waiting a reasonable time of said delay a certainty can be had that all packets compressed and sent by the mobile terminal UE are received and decompressed correctly by the decompressor of the source RNC. The source RNC will forward the possible downlink data to be sent to the mobile terminal UE to the target RNC (624), which confirms the relocation by sending Relocation_detect message to the new SGSN (626). The target RNC also sends a RNTI_reallocation message (628) to the mobile terminal UE, which indicates the identification of the new RNC to the mobile terminal and in which the target RNC compressor preferably transmits an indication of the context update, if required. This can be done only if the source RNC is already released from the connection after the snapshot has been transmitted to the target RNC (622). Otherwise, the context update has to be performed in connection of some later signalling between the target RNC and the mobile terminal UE. The mobile terminal UE acknowledges the change of RNC by sending a confirmation as a RNTI_reallocation_complete message (630). Now the relocation of the context information to the target RNC is performed successfully, while simultaneously preventing the out-of-synchronism of the contexts and minimising the break in the compression/decompression process.

The implementation of the third preferred embodiment of the invention in the UMTS system will be further explained with reference to FIG. 7, in which the mobile terminal is not informed in forehand about the relocation. Again, a decision is made in the radio resource controller RRC to perform SRNS relocation (700, 702), but the mobile terminal UE is not informed about this. The mobile terminal UE will continue to run the header compression and decompression normally, but the context updating of the mobile terminal context information is prevented by discarding in the source RNC compressor/decompressor any acknowledgements from the compressor/decompressor of the mobile terminal or by configuring the compressor of the source RNC not to send any acknowledgements during the relocation procedure. The process of discarding the acknowledgements will preferably take place logically in the PDCP layer on which the ROHC compression algorithm is run, since ROHC definitions does not include any implementation interface for enabling the required configuration. The source RNC is preferably informed about the discarding via the RRC (704). Because all acknowledgements are discarded by the source RNC, the context of the mobile terminal compressor is not updated but the mobile terminal will continue to compress and transmit the uplink data with the previous context information. After this, the source RNC starts a prior known SRNS relocation procedure, similar to what is described already above with respective reference numbers and therefore, it is not necessary to explain again herewith. A snapshot of the compression and decompression context information is taken in the source RNC, preferably during said SRNS relocation procedure, and transmitted to the target RNC at latest in a Relocation_commit message (722) to be stored in the target RNC. The process of accomplishing the SRNS and context information relocation is similar to what is described above, After the relocation procedure is finished, the RNC, which previously functioned as the source RNC will continue to function normally, i.e. it does not discard any acknowledgements from the compressor/decompressor of the mobile terminal UE. This embodiment enables the header compression context relocation to be performed also in conditions, where it might be impossible to inform the mobile terminal UE about the handover in advance.

An implementation of a further preferred embodiment of the invention in the UMTS system can be described with reference to FIG. 5, for example, wherein the context information snapshot is transmitted from the source RNC to the target RNC after the relocation process has started but before the command to take over the control of the connections (522, Relocation_commit message). The context information snapshot will preferably be transmitted with a prior known message, such as in Relocation_required message (506) or Relocation_request message (510), but the context information snapshot can also be transmitted as a further separate message. This further message will preferably take place after the in Relocation_required message (506), but in any case before the Relocation_commit message (522). However, the place of the message which transmits the context information snapshot is not restricted by any other means, but it can be sent any time after the relocation process has started but before the Relocation_commit message (522). This enables the target RNC to store said received context information and to configure its compressor and decompressor before the actual control is handed over by the Relocation_commit message. This way the context relocation can be performed efficiently, so that no break occurs in data compression/decompression but it can be continued seamlessly when the control is given by the Relocation_commit message.

If all acknowledgements are discarded by the source RNC, as is described in the third embodiment of the invention, there may occur a situation during the relocation process wherein the mobile terminal UE should update its context information, e.g. due to disturbance on the radio interface, and it sends context update request to the source RNC, but the update is not possible because the acknowledgements are discarded in the network and therefore the network does not send any update information. As a result, the context information of the mobile terminal UE is out-of-synchronism in respect to the snapshot context information currently being updated to the target RNC. Again a break will take place in the data compression/decompression, when the context information of the mobile terminal and the target RNC are synchronised.

According to a preferred embodiment of the invention, the synchronisation can be speeded up in the UMTS system by detecting the context update request sent by the mobile terminal in the source RNC, which attaches this indication to any message (e.g. Relocation_commit, 522 in FIG. 5) to be sent to the target RNC after the context update request has been detected. This way the target RNC receives information about the needed context update and after the relocation is accomplished, the target RNC can send the first packet to the mobile terminal as a context update message. Then mobile decompressor decompresses the received at least one packet of the at least one header with the stored decompression context information and updates it context information according to the received context update message. This will speed up the context re-synchronisation if the compression has failed during relocation procedure.

Similarly, the source RNC may as well end up in a situation during the relocation process wherein it should update its context information, but the update is not possible because it cannot send any acknowledgements to the mobile terminal UE. Also in this situation the above-mentioned embodiment of the invention can be utilised, wherein the context update indication is attached to any message (e.g. Relocation_commit) to be sent from the source RNC to the target RNC after the context update request has been detected. Again, the target RNC receives information about the needed context update, which will be further indicated to the mobile terminal, when the relocation process has been accomplished. Alternatively, said context update indication attached to the Relocation_commit message and sent by the source RNC to the target RNC can be used as a trigger in decompressor of the target RNC to initiate immediately a context refresh update.

The procedure of the embodiment can be performed, for example, in the following way: the context update need is indicated in the message sent from the source RNC to target RNC e.g. by two bits, such that a bit combination 00 means that no update is needed, a bit combination 01 means that the context of the decompressor of the mobile terminal UE is out-of-synchronisation, a bit combination 10 means that the contexts of the decompressors on the network side are out-of-synchronisation, and a bit combination 11 means that both the context of the decompressor of the mobile terminal UE and the contexts of the decompressors on the network side are out-of-synchronisation. Once this information is received by target RNC, it can start the context update procedure by sending context update packet to the mobile terminal UE (context update indication 01), by updating the context information of the source RNC by sending a context update request to the mobile terminal UE (context update indication 10), or respectively performing both of the above-mentioned operations (context update indication 11).

It is obvious to a person skilled in the art that while technology advances, the basic idea of the invention can be implemented in many different ways. The invention and its embodiments are thus not restricted to the examples described above, but can vary within the scope of the claims.

The invention claimed is:

[1. A method of relocating the header compression context in a packet network which transmits packets having compressed headers, said method comprising:

establishing a connection between a mobile terminal and a first network entity including storing context information used with compression and decompression of the headers of the packets at the mobile terminal and the, first network entity;

stopping the context information updating in the mobile terminal and in the first network entity;

taking a snapshot of the compression and decompression context information in the first network entity including storing said context information snapshot in the first network entity; and changing the connection between the first network entity and the mobile terminal to a connection between the mobile terminal and a second network entity including transferring the context information snapshot stored by the first network entity to the second network entity which is stored by the second network entity as the context information of the second network entity and using the stored context information at the mobile terminal and the second network entity for compression and decompression of the headers of the packets.]

[2. A method in accordance with claim 1 wherein:

said context information updating is stopped by disabling the mobile terminal and the first network entity decompressors from sending acknowledgements to the compressor of the opposite side.]

[3. A method in accordance with claim 1 wherein:

said context information updating is stopped by stopping the mobile terminal to compress and transmit uplink data and stopping the first network entity to compress and transmit downlink data.]

[4. A method in accordance with claim 3 wherein:

said taking a snapshot of the compression and decompression context information in the first network entity is delayed until said transmitted uplink data and downlink data has been received and decompressed.]

[5. A method in accordance with claim 1 wherein:

said context information updating is stopped by discarding in the first network entity compression/decompression acknowledgements from the mobile terminal.]

[6. A method in accordance with claim 1 wherein:

said context information updating is stopped by disabling in the first network entity to send compression/decompression acknowledgements to the mobile terminal.]

[7. A method in accordance with claim 5 wherein:

sending a context update request from the first network entity to the second network entity, in response to a detection of a context update request sent by the mobile terminal in the first network entity; and sending the first packet from the second network entity to the mobile terminal as a packet containing said context update request.]

[8. A method in accordance with claim 5 wherein:

sending a context update request from the first network entity to the second network entity, in response to a detection of out-of synchronism of the context information in the first network entity; and sending the first packet from the second network entity to the mobile terminal as a packet containing said context update request.]

[9. A method in accordance with claim 1 wherein:

transferring the context information snapshot stored by the first network entity to the second network entity before changing the connection between the first network entity and the mobile terminal to a connection between the mobile terminal and a second network entity.]

[10. A method in accordance with claim 1 wherein:

said method is used in accordance with Robust Header Compression (ROHC) implemented in a UMTS system.]

[11. A method in accordance with claim 10 wherein:

performing said relocation overlapping with serving radio network subsystem (SRNS) relocation.]

[12. A packet network in which packets having compressed headers are transmitted between a mobile terminal and network entities, said network comprising:

a connection is arranged to established between a mobile terminal and a first network entity;

context information used with compression and decompression of the headers of the packets is arranged to be stored at the mobile terminal and the first network entity;

the context information updating in the mobile terminal and in the first network entity is arranged to be stopped;

a snapshot of the compression and decompression context information is arranged to be taken at and stored in the first network entity;

the connection between the first network entity and the mobile terminal is arranged to be changed to a connection between the mobile terminal and a second network entity, whereby the context information snapshot stored by the first network entity is arranged to be transmitted to and stored in the second network entity as the context information of the second network entity; and the stored context information at the mobile terminal and the second network entity is arranged to be used for compression and decompression of the headers of the packets.]

[13. A packet network in accordance with claim 12 wherein:

said context information updating is arranged to be stopped by disabling the mobile terminal and the first network entity decompressors from sending acknowledgements to the compressor of the opposite side.]

[14. A packet network in accordance with claim 12 wherein:

said context information updating is arranged to be stopped by stopping the mobile terminal to compress and transmit uplink data and stopping the first network entity to compress and transmit downlink data.]

[15. A packet network in accordance with claim 14 wherein:

said taking a snapshot of the compression and decompression context information in the first network entity is arranged to be delayed until said transmitted uplink data and downlink data has been received and decompressed.]

[16. A packet network in accordance with claim 12 wherein:

said context information updating is arranged to be stopped by discarding in the first network entity compression/decompression acknowledgements from the mobile.]

[17. A packet network in accordance with claim 12 wherein:

said context information updating is arranged to be stopped by disabling in the first network entity to send compression/decompression acknowledgements to the mobile terminal.]

[18. A packet network in accordance with claim 16 wherein:

a context update request is arranged to be sent from the first network entity to the second network entity, in response to a detection of a context update request sent by the mobile terminal in the first network entity;

the first packet is arranged to be sent from the second network entity to the mobile terminal as a packet containing said context update request.]

[19. A packet network in accordance with claim 16 wherein:

a context update is arranged to be sent request from the first network entity to the second network entity, in response to a detection of out-of-synchronism of the context information in the first network entity; and the first packet is arranged to be sent from the second network entity to the mobile terminal as a packet containing said context update request.]

[20. A packet network in accordance with claim 12 wherein:

the context information snapshot stored by the first network entity is arranged to be transferred to the second network entity before changing the connection between the first network entity and the mobile terminal to a connection between the mobile terminal and a second network entity.]

[21. A packet network in accordance with claim 12 wherein:

said packet network is a UMTS system, wherein Robust Header Compression (ROHC) is implemented.]

*22. An apparatus comprising:*

*a transmitter configured to transmit packets;*

*a receiver configured to receive packets;*

*a memory configured to store context information used with compressing and decompressing of packet headers;*

*the apparatus configured to:*

*establish a connection between the apparatus and a first network entity;*

*store in the memory, updated context information used with the compressing of the packet headers;*

*receive, from the first network entity, a RRC signalling indicating a SRNS (Serving Radio Network Subsystem) relocation and a header compression context relocation to be performed;*

*in response to receiving the header compression context relocation indication in the RRC signalling, stop updating the stored context information used with the compressing of the packet headers;*

*use the stored updated context information for compression of the packet headers to be transmitted to a second network entity after the SRNS relocation.*

*23. The apparatus of claim 22, further configured to:*

*receive an indication of a handover of the connection from the first network entity to the second network entity.*

*24. The apparatus of claim 23, further configured to stop updating the context information used with the compressing and decompressing of the packet headers upon receiving the indication of the handover of the connection from the first network entity to the second network entity.*

*25. The apparatus of claim 22, further configured to stop updating the context information used with the compressing and decompressing of the packet headers when no acknowledgement for context update is received from the first network entity.*

*26. A method of communication in an apparatus comprising:*

*establishing a connection between the apparatus and a first network entity;*

*storing in a memory, updated context information used with compressing of packet headers;*

*receiving, from the first network entity, a RRC signalling indicating a SRNS (Serving Radio Network Sub-system) relocation and a header compression context relocation to be performed;*

*in response to receiving the header compression context relocation indication in the RRC signalling, stopping updating of the stored context information used with the compressing of the packet headers;*

*communicating packets to a second network entity using the stored updated context information for compression of the packet headers after the SRNS relocation.*

*27. The method of claim 26, further comprising:*

*receiving from the first network entity, an indication of handover of the communication connection to the second network entity.*

*28. The method of claim 27, wherein the updating of the context information is stopped upon receiving of the indication of the handover.*

*29. The method of claim 27, wherein the updating of the context information is stopped when no acknowledgement for context update is received from the first network entity.*

*30. An apparatus comprising:*

*a transmitter;*

*a receiver;*

*a memory; and*

*a processor communicatively coupled to the transmitter, receiver, and memory, the processor configured to:*

*store in the memory a context information, the context information being used by the apparatus for compressing of packet headers for communication over a first connection with a first network entity,*

*receive, from the first network entity, a RRC signalling indicating a SRNS (Serving Radio Network Subsystem) relocation and a header compression context relocation to be performed;*

*in response to receiving the header compression context relocation indication in the RRC signalling, stop updating the context information,*

*establish a second connection with a second network entity, and*

*use the stored context information for compression of the packet headers for communication over the second connection with the second network entity after the SRNS relocation.*

*31. The apparatus of claim 30, the processor is further configured to:*

*receive an indication of a handover of the connection from the first network entity to the second network entity.*

*32. The apparatus of claim 31, the processor is configured to stop updating the context information upon receiving the indication of the handover of the connection from the first network entity to the second network entity.*

*33. The apparatus of claim 30, the processor is configured to stop updating the context information when no acknowledgement for context update is received from the first network entity.*

* * * * *